US010367098B2

(12) United States Patent
Li et al.

(10) Patent No.: US 10,367,098 B2
(45) Date of Patent: Jul. 30, 2019

(54) VERTICAL JFET MADE USING A REDUCED MASKED SET

(71) Applicant: United Silicon Carbide, Inc., Monmouth Junction, NJ (US)

(72) Inventors: Zhongda Li, Somerset, NJ (US); Anup Bhalla, Princeton Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/947,010

(22) Filed: Apr. 6, 2018

(65) Prior Publication Data

US 2018/0226513 A1   Aug. 9, 2018

Related U.S. Application Data

(63) Continuation of application No. 14/798,631, filed on Jul. 14, 2015, now abandoned.

(51) Int. Cl.

| | |
|---|---|
| *H01L 29/06* | (2006.01) |
| *H01L 29/47* | (2006.01) |
| *H01L 29/808* | (2006.01) |
| *H01L 29/66* | (2006.01) |
| *H01L 29/10* | (2006.01) |

(Continued)

(52) U.S. Cl.
CPC .... *H01L 29/8083* (2013.01); *H01L 21/02378* (2013.01); *H01L 21/02529* (2013.01); *H01L 21/045* (2013.01); *H01L 21/046* (2013.01); *H01L 21/047* (2013.01); *H01L 21/0465* (2013.01); *H01L 21/0475* (2013.01); *H01L 21/0485* (2013.01); *H01L 21/76897* (2013.01); *H01L 29/0619* (2013.01); *H01L 29/0661* (2013.01); *H01L 29/1066* (2013.01); *H01L 29/1608* (2013.01); *H01L 29/45* (2013.01);
(Continued)

(58) Field of Classification Search
CPC ........... H01L 29/8083; H01L 21/02378; H01L 29/45; H01L 29/1608; H01L 29/1066; H01L 29/66068; H01L 29/0661; H01L 29/0619; H01L 21/76897; H01L 21/0485; H01L 21/0475; H01L 21/047; H01L 21/0465; H01L 21/046; H01L 21/045; H01L 29/06; H01L 29/47
See application file for complete search history.

(56) References Cited

U.S. PATENT DOCUMENTS

| | | |
|---|---|---|
| 5,233,215 A | 8/1993 | Baliga |
| 6,855,970 B2 | 2/2005 | Hatakeyama et al. |

(Continued)

FOREIGN PATENT DOCUMENTS

WO   WO 2012-131768   10/2012

*Primary Examiner* — Joseph C. Nicely
*Assistant Examiner* — Lamont B Koo
(74) *Attorney, Agent, or Firm* — BakerHostetler LLP

(57) ABSTRACT

A vertical JFET made by a process using a limited number of masks. A first mask is used to form mesas and trenches in active cell and termination regions simultaneously. A maskless self-aligned process is used to form silicide source and gate contacts. A second mask is used to open windows to the contacts. A third mask is used to pattern overlay metallization. An optional fourth mask is used to pattern passivation. Optionally the channel may be doped via angled implantation, and the width of the trenches and mesas in the active cell region may be varied from those in the termination region.

20 Claims, 18 Drawing Sheets

(51) Int. Cl.
*H01L 29/16* (2006.01)
*H01L 21/02* (2006.01)
*H01L 21/04* (2006.01)
*H01L 29/45* (2006.01)
*H01L 21/768* (2006.01)

(52) U.S. Cl.
CPC .. *H01L 29/66068* (2013.01); *H01L 29/66909* (2013.01); *H01L 29/0696* (2013.01)

(56) References Cited

U.S. PATENT DOCUMENTS

| | | |
|---|---|---|
| 7,009,228 B1 | 3/2006 | Yu |
| 8,519,410 B1 | 8/2013 | Odekirk et al. |
| 2005/0029557 A1 | 2/2005 | Hatakeyama et al. |
| 2005/0258454 A1 | 11/2005 | Kumar et al. |
| 2006/0071217 A1 | 4/2006 | Ohyanagi et al. |
| 2006/0214242 A1 | 9/2006 | Carta et al. |
| 2010/0163935 A1 | 7/2010 | Shimizu et al. |
| 2010/0314659 A1* | 12/2010 | Yilmaz ............ H01L 21/26586 257/139 |
| 2013/0168764 A1* | 7/2013 | Hsieh ............... H01L 29/41741 257/331 |
| 2014/0084363 A1 | 3/2014 | Pearse et al. |
| 2015/0084120 A1 | 3/2015 | Weber et al. |
| 2015/0200250 A1 | 7/2015 | Lin et al. |
| 2015/0236089 A1 | 8/2015 | Kagotoshi et al. |
| 2015/0349091 A1 | 12/2015 | Yilmaz et al. |

\* cited by examiner

VERTICAL JFET MADE USING A REDUCED MASKED SET

CROSS-REFERENCE TO RELATED APPLICATIONS

This application is a continuation of U.S. patent application Ser. No. 14/798,631 filed on Jul. 14, 2015 entitled "Vertical JFET made using a reduced mask set," the contents of which are hereby incorporated by reference in their entirety.

BACKGROUND

Vertical junction field-effect transistors (JFETs) made from materials such as silicon carbide (SiC) are useful in power electronic circuits, such as power factor correction (PFC) circuits, DC-DC converters, DC-AC inverters, and motor drives. The performance of vertical SiC JFETs may be improved through the use of edge terminations.

SUMMARY

A vertical JFET is made from semiconductor materials such as silicon carbide (SiC) by a process using a limited number of masks. A first mask is used to form mesas and trenches in active cell and termination regions simultaneously. A mask-less self-aligned process is used to form silicide source and gate contacts. A second mask is used to open windows to the contacts. A third mask is used to pattern overlay metallization. An optional fourth mask is used to pattern passivation. Optionally, the channel may be doped via one or more angled implantations, and the width of the trenches and mesas in the active cell region may be varied from those in the termination region.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying figures. The figures are not necessarily drawn to scale.

FIG. 5 is a cross-sectional view of the starting material for fabricating the JFET.

FIG. 6 is a cross-sectional view of the JFET of the first embodiment in process after trench etching using a hard masking layer that is defined by a first mask.

FIG. 7 is a cross-sectional view of the JFET of the first embodiment in process after vertical and tilted implantations of the first doping type with the hard masking layer in place.

FIG. 8 is cross-sectional view of the JFET of the first embodiment in process after oxide spacer and silicide formation in the active cell region and the termination region.

FIG. 9 is a cross-sectional view of the JFET of the first embodiment in process after trench filling and window opening for source and gate contacts using a second mask.

FIG. 10 is a cross-sectional view of the JFET of the first embodiment in process after depositing and patterning the top metal using a third mask.

FIG. 11 is cross-sectional view of the completed JFET after forming the passivation layer using a fourth mask.

DETAILED DESCRIPTION OF ILLUSTRATIVE EMBODIMENTS

A vertical JFET may be made from semiconductor materials such as silicon carbide (SiC) by a process using a limited number of masks in a simplified process, thereby reducing costs. A first mask is used to form mesas and trenches in active cell and termination regions simultaneously. A mask-less self-aligned process is used to form silicide source and gate contacts. A second mask is used to open windows to the contacts. A third mask is used to pattern overlay metallization. An optional fourth mask is used to pattern passivation. Optionally the channel may be doped via angled implantation, and the width of the trenches and mesas in the active cell region may be varied from those in the termination region.

Additional masks may be employed to implement a number of variations. For example, channel implant and silicide formation in the termination region may be blocked by additional masks, or additional masks may be employed to remove certain features from the termination region after they are formed across the wafer.

Figure 1:
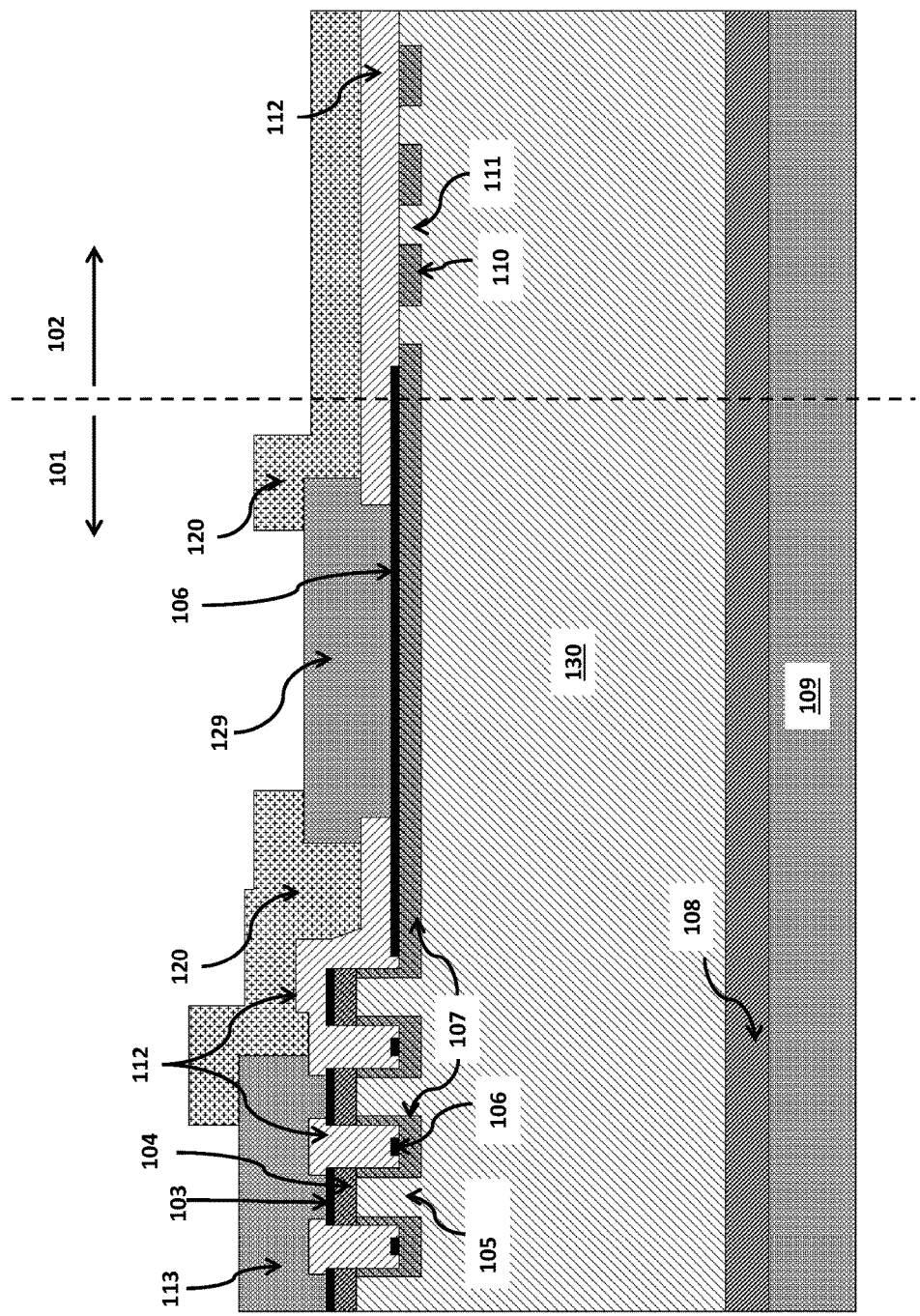
FIG. 1 provides, for reference, a cross-sectional view of a prior art vertical JFET with planar floating guard-ring termination.

FIG. 1 is a cross-sectional view of a prior art SiC vertical channel JFET with planar guard ring termination. In the active region 101, the source electrode 113 is at the top, and the drain electrode 109 is at the bottom. The gate electrode 129 is connected by a gate silicide 106 to a gate region 107, which is doped with a first doping type. The gate silicide 106 is present at the bottoms of the trenches as well as beneath the gate electrode 129. The gate silicide 106 is electrically contiguous, although the connections from the trench bottoms to the area beneath the gate electrode is not shown in FIG. 1. The source electrode 113 is connected by a source silicide 103 to the source region 104, which is heavily doped with a second doping type. The drain electrode 109 contacts the drain region 108 that is heavily doped with the second doping type. The gate region 107 extends to the bottoms and side walls of the trenches, and is formed by implantation of the first doping type at zero degrees and at tilted angles. The channel region 105 is doped with the second doping type and connects the source region 104 through the drift region 130 to the drain region 108. In the termination region 102, the guard rings 110 are heavily doped with the first doping type, and the gaps 111 between each of the guard rings are doped with the second doping type. The potential of the guard rings 110 are floating. The termination region 102 and portions of the active cell region 101 are usually covered by an interlayer dielectric 112 and/or a passivation layer 120. The interlayer dielectric 112 also fills the trenches.

Figure 2:
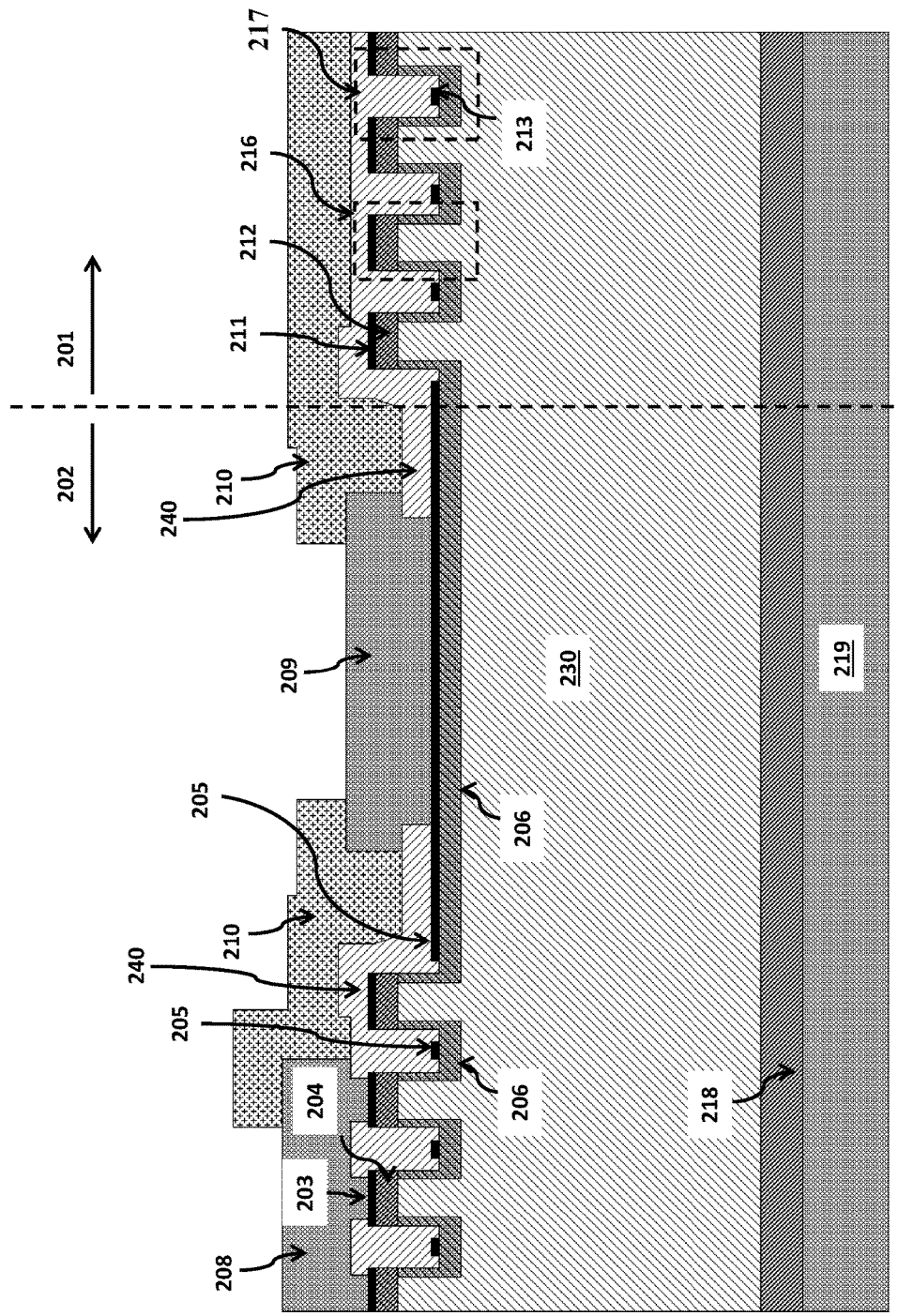
FIG. 2 illustrates a cross-sectional view of a first illustrative embodiment of a vertical JFET with trench guard-ring terminations made using a set of four masks.

FIG. 2 is a cross-sectional view of an illustrative first embodiment of a vertical JFET with trench guard-ring terminations made using a set of four masks. The drain electrode 219 contacts the drain region 218, which is heavily doped with the second doping type. Above the drain region 218 is the drift region 230. There are trenches 217 in both the active cell region 202 and the termination region 201, and these trenches are of the same width and are etched simultaneously. The trenches are separated by mesas 216. The width of the mesas 216 in the termination region 201 can either be equal to, smaller than, or larger than the width of the mesas in the active cell region 202.

The vertical channel JFET in the active cell 202 contains the gate region 206 that is formed by implantation of the first doping type into the bottom and the sidewall of the trenches. The gate region 206 extends to the sidewalls and bottom of the trenches. The gate region 206 is implanted vertically, to dope the trench bottom, and also implanted using a tilted angle, to dope the sidewalls 207 of the mesas 216. The same implantations dope the bottom and sidewalls of the trenches in both the termination region 201 and the active region 202. The mesas in the termination region 201 have a heavily doped region 212 of the second doping type at the top. This region 212 is formed at the same time as the source region 204 in the active cell region 202. In the active cell region 202, the source silicide contact 203 sits on top of the mesa. The gate silicide contact 205 sits at the bottom of the trench. In the termination region 201, there is a silicide 211 on top of the mesa and a silicide 213 at the bottom of the trench. All the silicide contacts are formed simultaneously using self-aligned processes. The source silicide contacts 203 in the active cell region are connected to the source electrode 208. The gate silicide contacts 205 are connected to the gate electrode 209. The silicide contacts in the termination region 211 and 213 are floating. The trenches are filled with an interlayer dielectric 240. The JFET is shown with a passivation layer 210.

Figure 3:
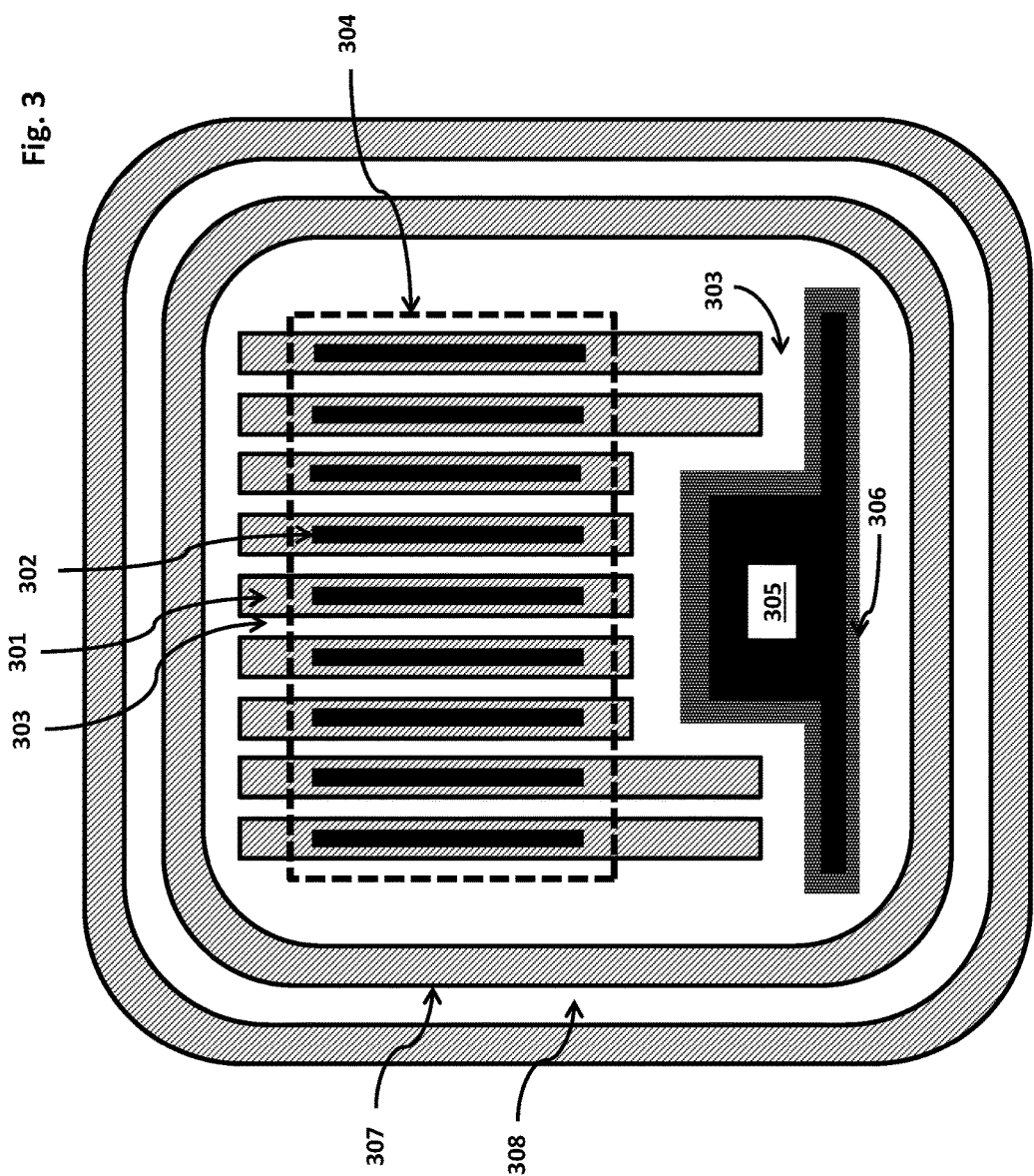
FIG. 3 is a top view of an example layout for the JFET of the first embodiment.

FIG. 3 is a top view of an example layout of a JFET such as the JFET of the first embodiment. In the active area, the mesas 301 are parallel to each other. In the termination region, the mesas 307 are concentric. Outside of the mesas 301, the semiconductor, such as Si and SiC, is etched, leaving trenches in the active area 303 and trenches in the termination region 308. Silicide contacts are formed on the top of the mesas 301 and at the bottom of the active trenches 303, using a self-aligned process. The self-aligned process uses an oxide spacer to ensure that the silicide at the top of the mesas 301 does not short to the silicide at the bottom of the trenches 303. A source contact window 302 is opened in the inter-layer dielectric to make contact between the source silicide 301 and the source overlay metal 304. The gate contact window 305 is opened in the inter-layer dielectric to make contact between the gate silicide contacts 303 to the gate overlay metal 306. In the termination area, the mesas 307 and trenches 308 are formed at the same time as those in the active region, and silicide contacts may be formed on top of the mesas 307 and at the bottom of the trenches 308, during the same self-aligned silicide formation process in the active region. However, if any such contacts are formed in the termination region, they are not connected to the gate overlay metal 306 or the source overlay metal.

Figure 4:
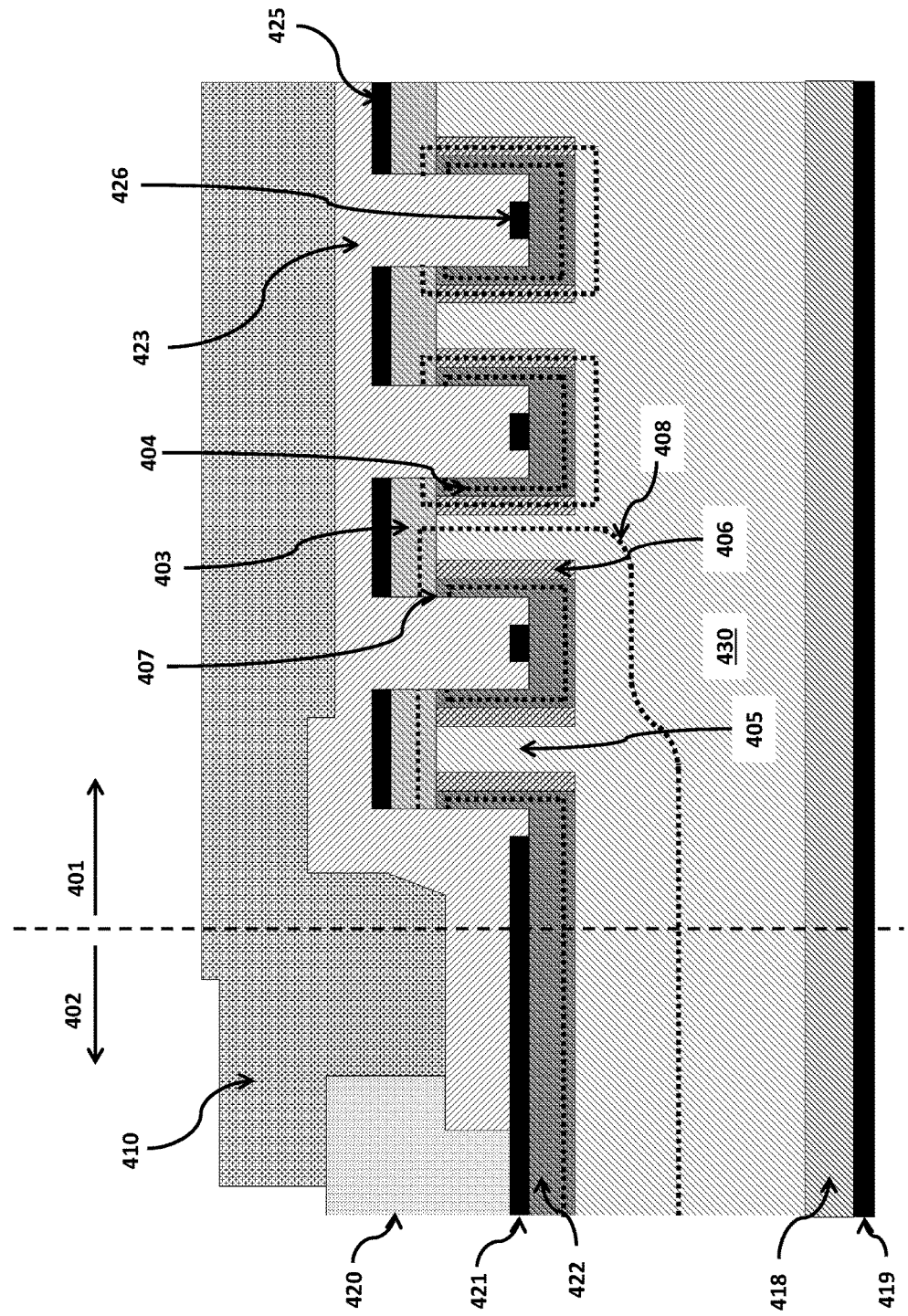
FIG. 4 is a cross-sectional view of the termination region of the JFET of the first embodiment.

FIG. 4 is an annotated cross-sectional view of the termination region 401 of the JFET of the first embodiment. For purposes of the examples herein, it may assumed that this is an npn JFET, such that the first doping type is p-type and the second doping type is n-type. In practice, npn and pnp devices may be made by the processes described herein. As the drain voltage increases, the p-n junction 407 between the heavily doped region of the second doping type 403 and the mesa sidewall 404, which is doped with the first type, is reverse biased, while the regions in the middle of the mesa doped with the second doping type 405 and 406 are being depleted. Once the mesa is fully depleted, i.e., punched through, the reverse voltage on the p-n junction 407 in the mesa stops increasing, and the further voltage will be supported in the next mesa. As a result, each mesa supports the punch through voltage of the mesa. For this termination to work, the punch through voltage of the mesa needs to be less than the breakdown voltage of the p-n junction 407 in the mesa, which determines the maximum mesa width that can be used. The total voltage that can be supported by the termination can be increased by adding more and more trench-mesa pairs to create a potential ladder. Note that in the termination region 401, the silicides 425 and 426 are floating. Also shown in FIG. 4 are a drain contact 419, at the bottom, connected to a drain region 418. The drain region 418 is in turn connected to the drift region 430. The trenches are filled with interlayer dielectric 423 and the device is topped with a passivation layer 410. In the active region 402, the gate silicide 421 connects the gate electrode 420 to the gate region 422. The dashed boundary 408 illustrates the depletion layer edge when the first termination mesa is fully depleted, and the second is partially depleted.

The basic processes for the various illustrative embodiments of the JFETs of the present invention are illustrated in FIGS. 5 through 11 with cross-sectional views of a first illustrative embodiment of a JFET as a work in process. Silicon or SiC JFETs are made using two dopant types, n-type and p-type. Herein "the first dopant type" refers to the gate implant type of the JFET, and the "the second dopant" type refers to the dopant type used for the source and drain. The descriptions of the structures and processes herein apply equally to n-channel and p-channel devices. An n-channel device uses n-type regions for source and drain, and has a p-type gate region.

Figure 5:
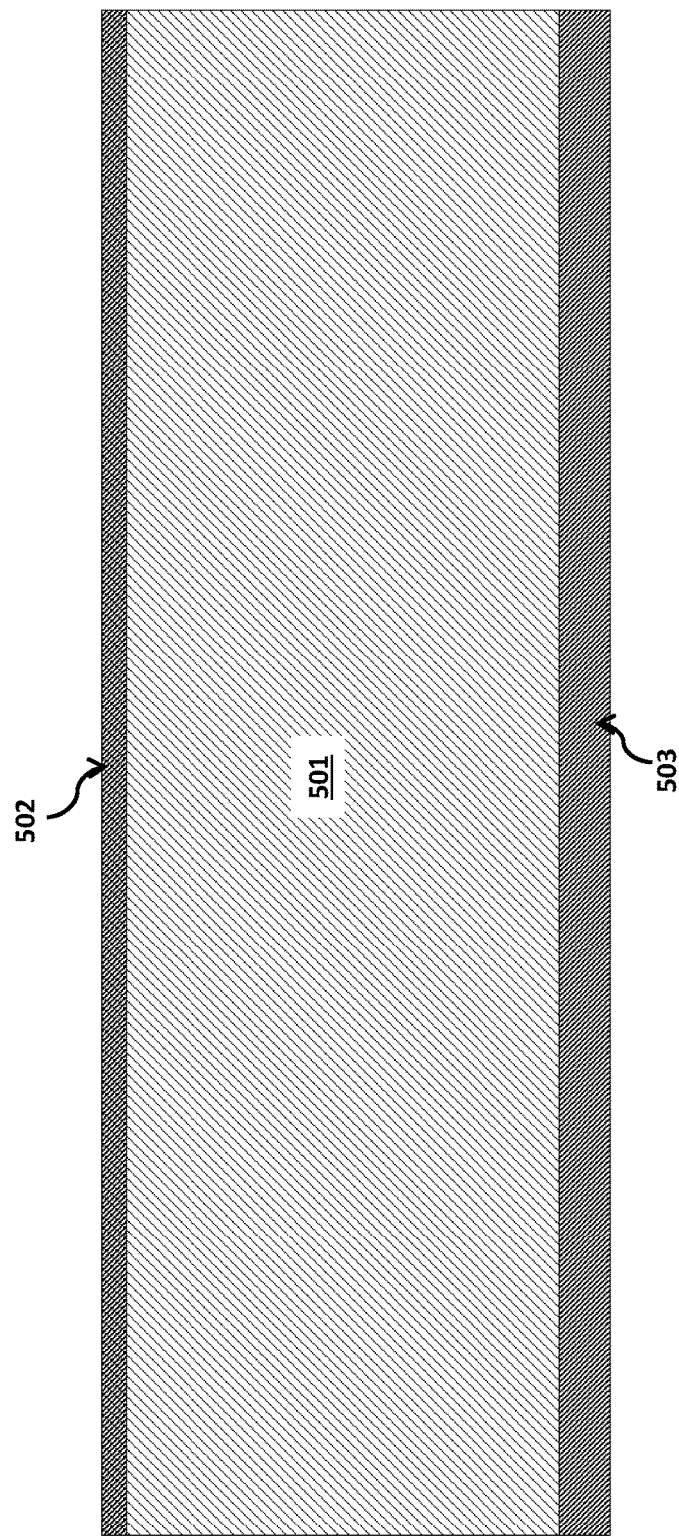
FIGS. 5-11 are cross-sectional views of the JFET of the first embodiment as a work in process through various stages of manufacture.

The starting material illustrated in FIG. 5 is a wafer containing a heavily doped top layer 502 of the second doping type to be used for source contacts. The top heavily doped region 502 can be formed either by epitaxy or by implantation. Below that are a region of one more layers doped with the second doping type 501 for use as channel and drift regions. The layers 501 can could be formed by epitaxy. The bottom layer of the starting wafer is a heavily doped substrate 503 of the second doping type which will be used for a drain contact.

Figure 6:
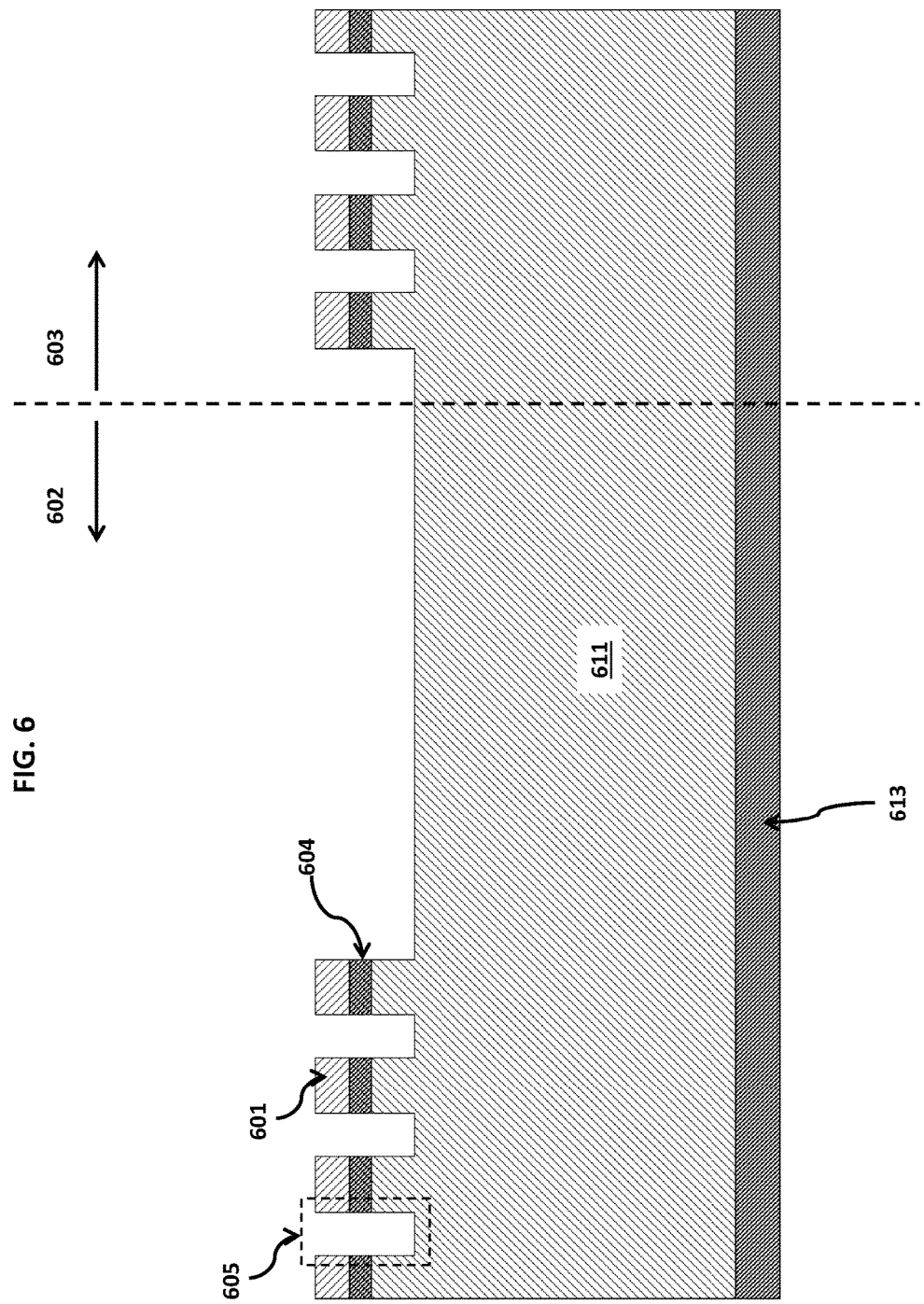

FIG. 6 illustrates a cross-sectional view of the JFET in process as seen after trench etching using a first mask. To create the structure shown, a hard masking layer 601 is first deposited on top of the heavily doped region of the second type 604. The hard masking layer 601 can be oxide, metal, or both. Next, the hard masking layer 601 is patterned using the first mask, and etched. Then the trenches 605 in both the active cell region 602 and the termination region 603 are etched simultaneously using the hard masking layer 601. The trenches 605 extend into the drift region 611. Also shown in FIG. 6 is the drain region 613.

Figure 7:
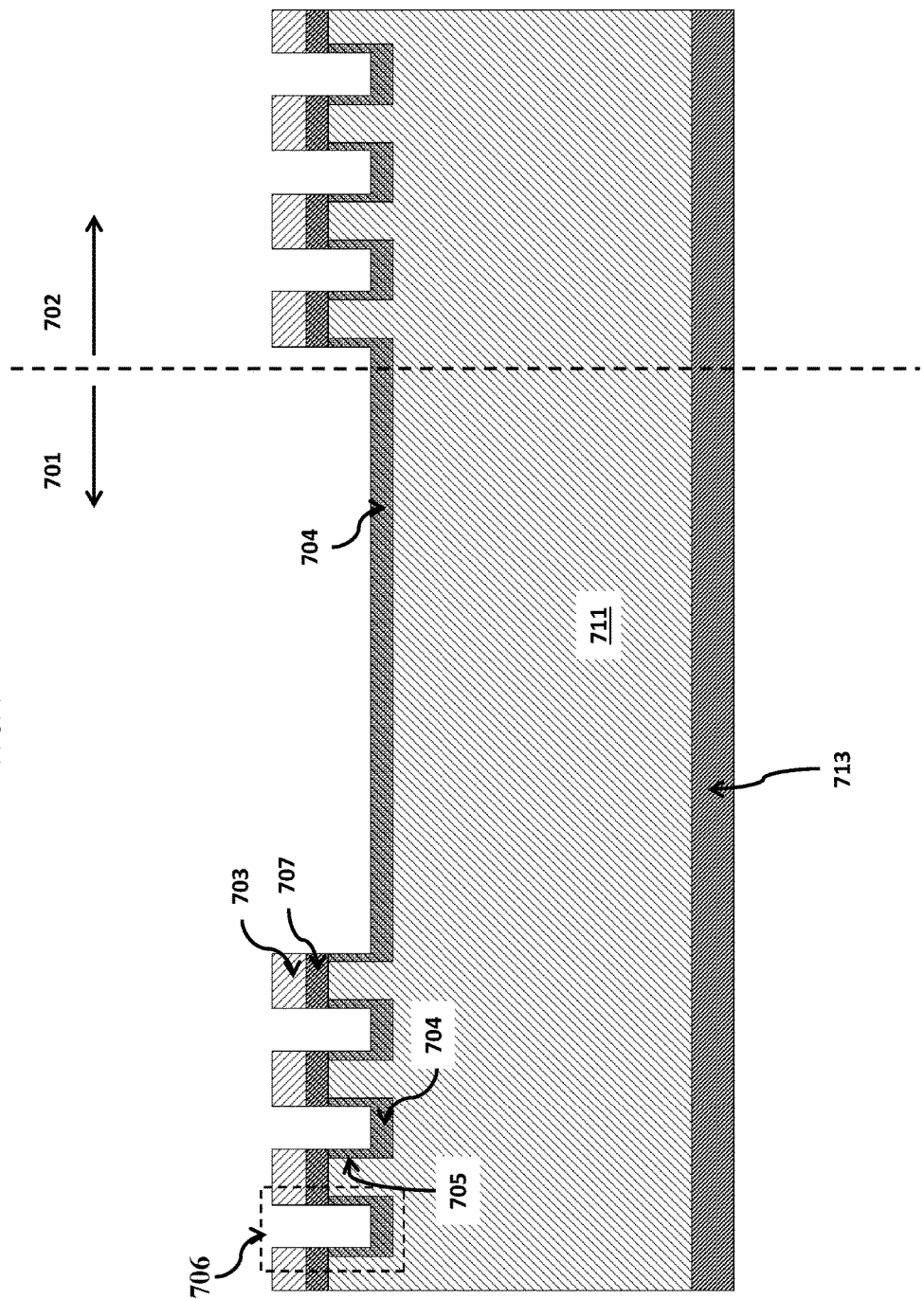

FIG. 7 illustrates a cross-sectional view of the JFET in process as seen after implantations of the first doping type. The implantations are performed without removing the hard masking layer 703. No masks are needed for this step. A vertical implantation of the first doping type forms the heavily doped regions 704 at the bottom of the trenches 706 in both the active cell region 701 and the termination region 702. The hard masking layer 703 protects source region 707 from being counter-doped by the implantation. A tilted implantation of the first doping type forms the less-heavily doped regions 705 on the side walls of the trenches 706. The hard mask 703 is removed after implantations, and the wafer is annealed to activate the implanted dopants. Also shown in FIG. 7 are the drift region 711 and the drain region 713.

Figure 8:
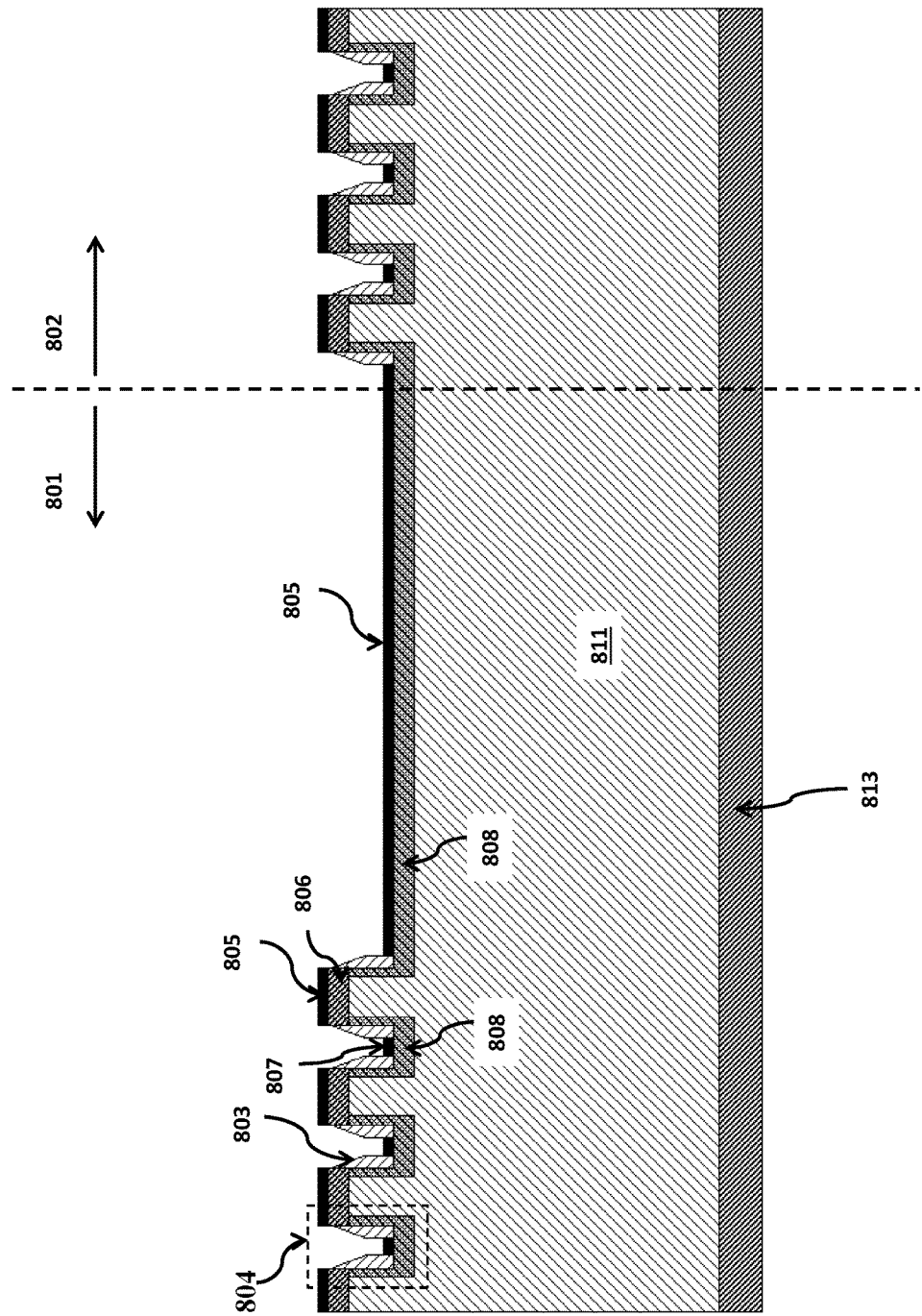

FIG. 8 illustrates a cross-sectional view of the JFET in process as seen after a self-aligned silicide contact formation. The silicide contacts 805 and 807 are formed simultaneously in the active region 801 and termination region 802, without using any masks. First, the oxide spacers 803 on the side walls of the trenches 804 are formed by depositing and/or growing oxide, followed by blanket etching back. Using an etching process that operates primarily vertically, the spacers 803 remain only on mesa sides. Next an ohmic metal, such as Ni, is deposited and annealed using rapid thermal annealing to form the silicide. Because Ni does not react with oxide, the silicide only forms on top of the second-doping-type regions 806 and the first-doping-type regions 808. The unreacted Ni on the oxide spacers 803 is then removed, and thus there is no shorting path between the source silicide 805 and the gate silicide 807. Also shown in FIG. 8 are the drift region 811 and the drain region 813.

Figure 9:
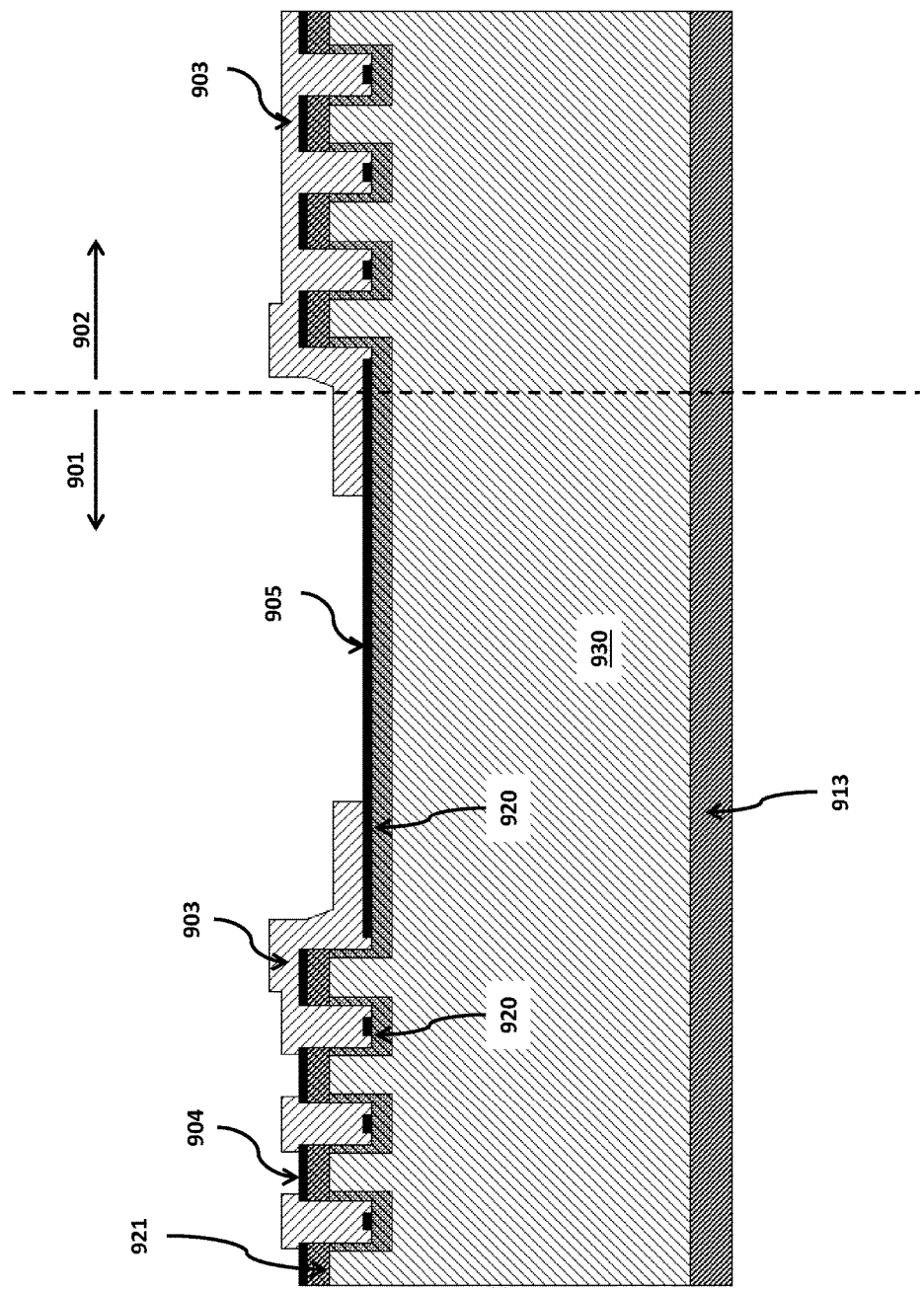

FIG. 9 illustrates a cross-sectional view of the JFET in progress as seen after contact window opening using a second mask. First an interlayer dielectric 903, such as oxide, is deposited on the wafer, filling the trenches. Next the second mask is used to pattern the contact windows to the source silicide 904 and gate silicide 905. The windows are then cleared by etching. In the active region 901, the source contact windows 904 are opened in each of the cells. A shared gate contact window 905 is opened outside the cells. In the termination region 902, no contact window is opened, and thus all the silicide contacts are under the inter-layer dielectric 903. Also shown in FIG. 9 are the drift region 930, the drain region 913, the gate region 920, and the source region 921.

Figure 10:
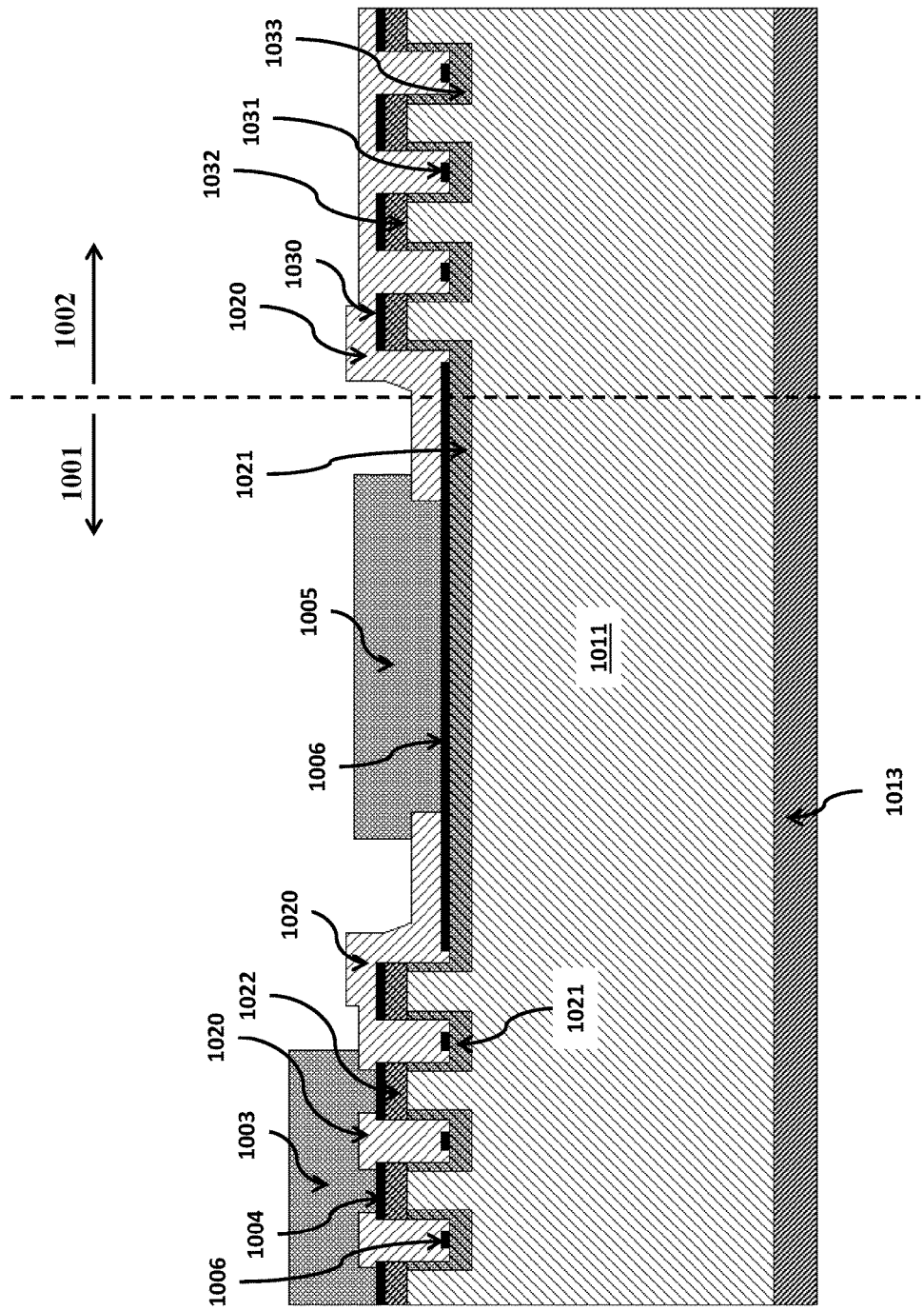

FIG. 10 illustrates a cross-sectional view of the JFET in progress as seen after an overlay metal is defined using a third mask. A conductor such as a metal is deposited, patterned using the third mask, and etched, leaving source electrode 1003 and gate electrode 1005 separated by the interlayer dielectric 1020. In the active area 1001, the source electrode 1003 makes contact to the source silicide contacts 1004 on top of each mesa, and thereby to the source region 1022. Also in the active area 1001, the gate electrode 1005 makes contact to the gate silicide contact 1006 and gate thereby the gate region 1021. In the termination region 1002, the silicide contacts 1030 and 1031 are not connected to any overlay metal, and thus their potential is floating. Also shown in FIG. 10 are the drift region 1011, the drain region 1013, and the termination region mesa top 1032, and the termination region trench side walls and bottom 1033, which are now distinct from the similarly formed structures in the active cell region 1001 by virtue of not being connected to the source or gate electrodes respectively.

Figure 11:
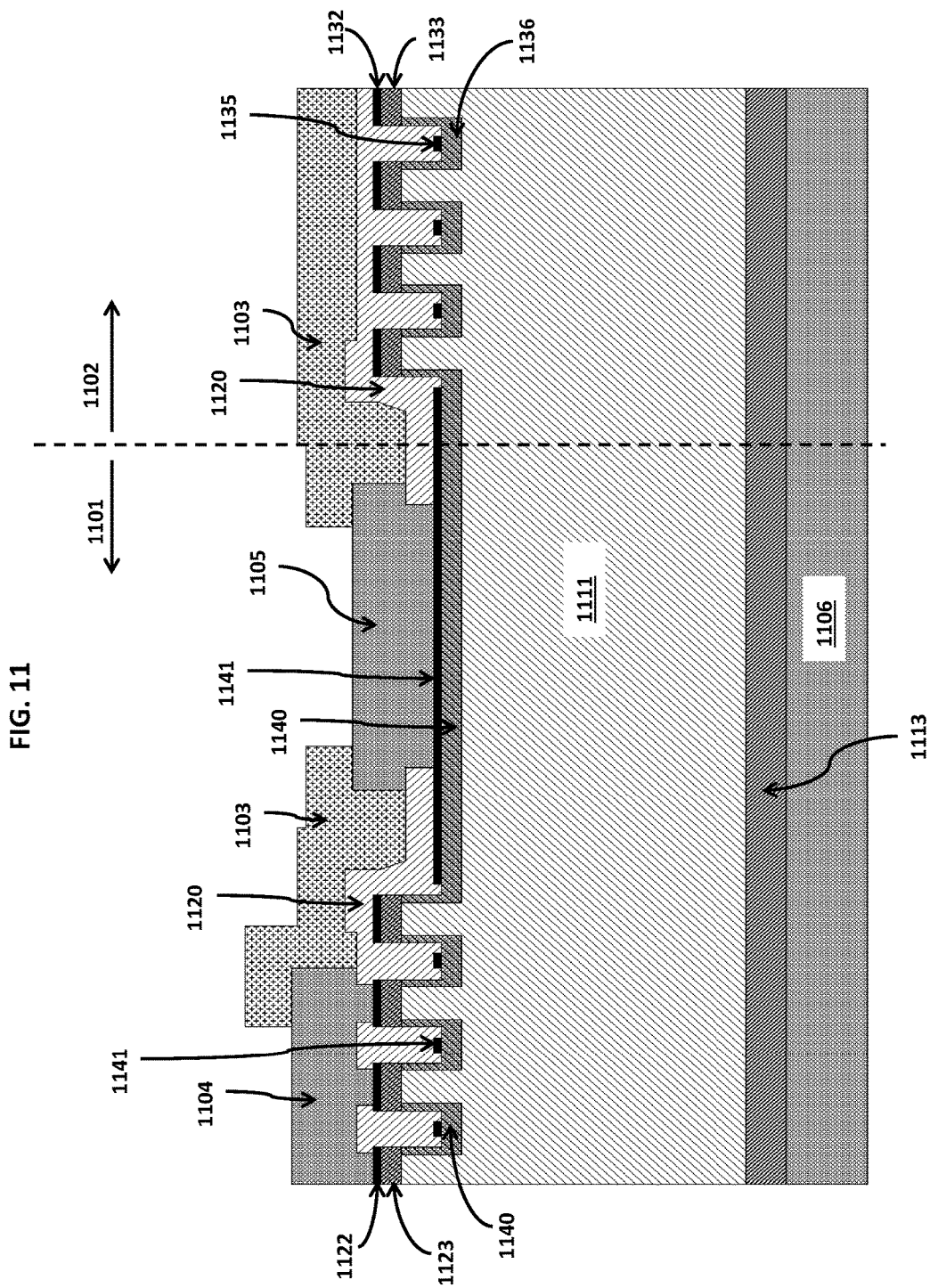

FIG. 11 illustrates a cross-sectional view of the completed JFET as seen after forming a passivation layer using a fourth mask. To create this structure, a passivation material, such as benzo-cyclo-butene (BCB), is first deposited on top of the wafer. Next, in the active region 1101, a passivation layer 1103 is patterned using the fourth mask to open the windows through the passivation material to the source electrode overlay metal 1104 and to the gate electrode overlay metal 1105. No window through the passivation layer 1103 is opened in the termination region 1102. It is, of course, possible to entirely skip this passivation step, e.g., if the oxide layer under the BCB were sufficient to ensure device reliability. Lastly, through backside processes such as wafer thinning, drain contact formation, and backside metallization, a drain contact 1106 is formed to complete the JFET process. Also shown in FIG. 11 are drain region 1113, drift region 1111, source silicide 1122, source region 1123, gate silicide 1141, gate region 1140, interlayer dielectric 1120, termination region silicides 1135 and 1132, and termination doped regions 1133, and 1136.

Figure 12:
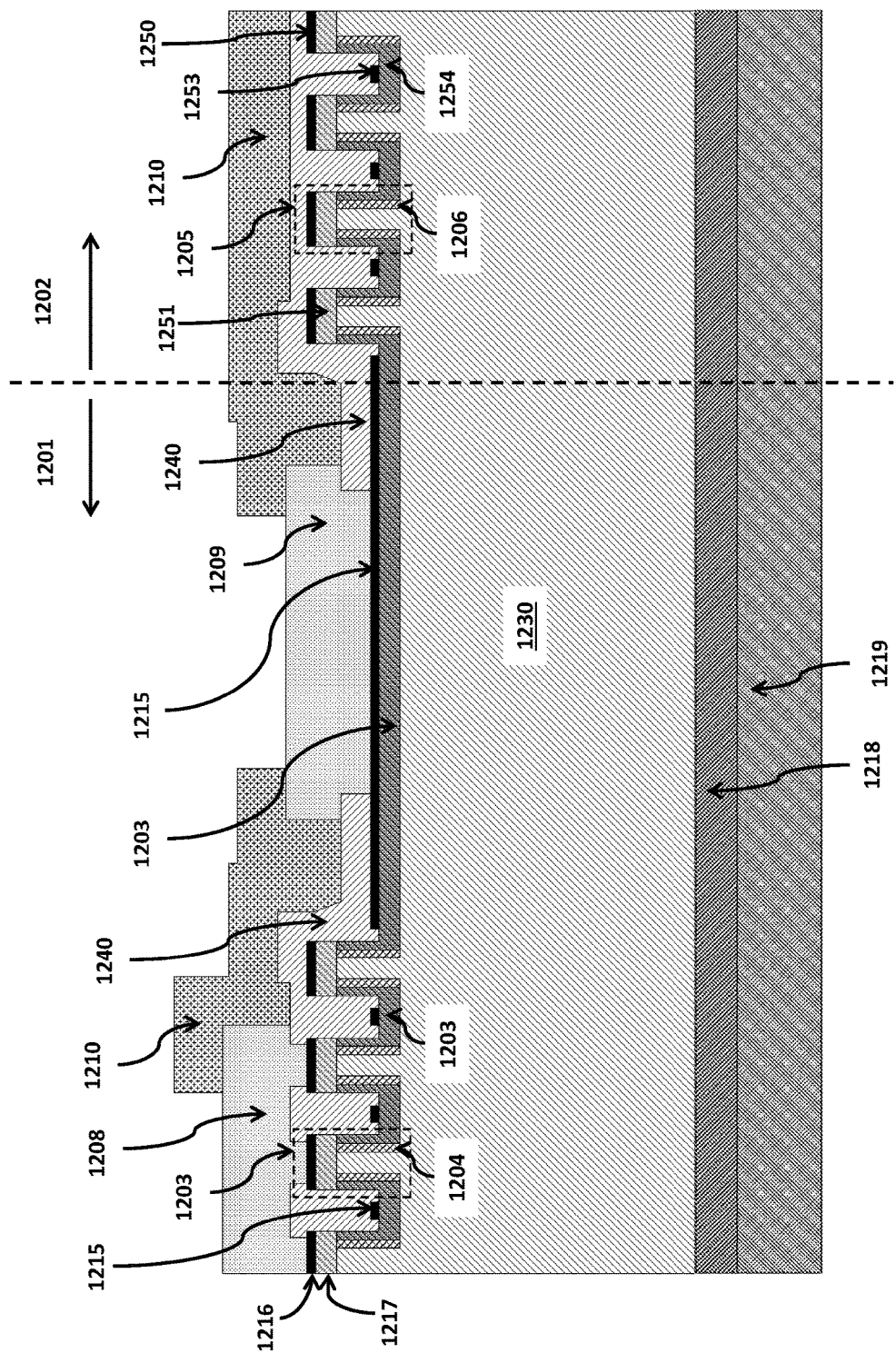
FIG. 12 is a cross-sectional view of a second illustrative embodiment of a JFET.

FIG. 12 illustrates a cross-sectional view of a second embodiment of a trench terminated JFET. The second embodiment is similar to the first embodiment shown, e.g., in FIGS. 5-11. However, here in FIG. 12, in the active region 1201, the sidewall of the channel region 1204 of the mesa 1203 has been doped by an implantation of the second doping type. This is done to lower the channel resistance and achieve better control of the threshold voltage. For example, such implantation may be done after the vertical and tilted implantations of the first doping type discussed above in reference to FIG. 7. The channel implantation of the second doping type may be done without using any mask, i.e., after the removal of the hard masking layer 703. As a result, as seen in FIG. 12, the side wall 1206 of the mesa 1205 in the termination region 1202 is also doped by this implantation. This doped region 1206 in the termination region 1202 does not affect the functionality of the trench guard-ring termination. It is possible to compensate for the added charges by reducing the width of the mesas 1205 in the termination region 1202. This implantation is followed by activation annealing. Also shown in FIG. 12 are drain contact 1219, drain region 1218, drift region 1230, source silicide 1216, source region 1217, source electrode 1208, gate silicide 1215, gate region 1203, gate electrode 1209, interlayer dielectric 1240, passivation 1210, termination region silicides 1250 and 1253, and termination doped regions 1251 and 1254.

Figure 13:
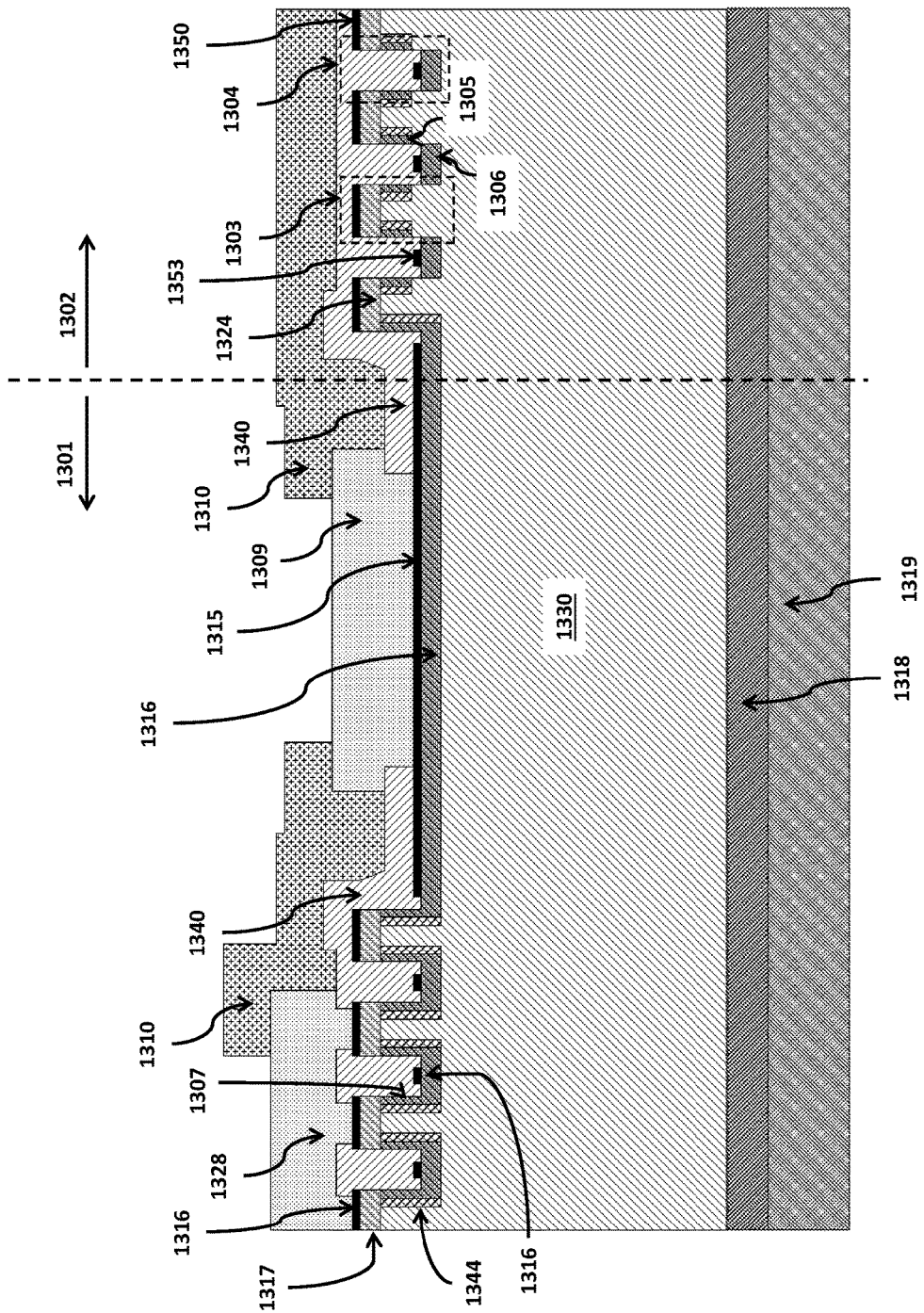
FIG. 13 is a cross-sectional view of a third illustrative embodiment of a JFET.

FIG. 13 is a cross-sectional view of a third illustrative embodiment of a trench terminated JFET. The third embodiment is similar to the second embodiment shown in FIG. 12, but here in FIG. 13, in the termination region 1302, the width of the trenches 1304 is narrower than the width of the trenches in the active cell region 1301. The tilted implantation of the first doping type is done simultaneously for the active cell region 1301 and the termination region 1302 using the same tilt angle. The tilt angle is chosen such that the side-wall first-doping-type region 1307 reaches the bottom of the first-doping-type region only in the active cell region 1301. In the termination region 1302, there is a gap between the side-wall of the first-doping-type region 1305 and the first-doping-type region 1306. This gap increases the voltage that can be supported in each mesa in the termination region 1302. Also shown in FIG. 13 are drain contact 1319, drain region 1318, drift region 1330, source silicide 1316, source region 1317, source electrode 1328, gate silicide 1315, gate region 1316, gate electrode 1309, channel implant region 1344, interlayer dielectric 1340, passivation 1310, termination region silicides 1350 and 1353, and termination region mesa top doped region 1324.

Figure 14:
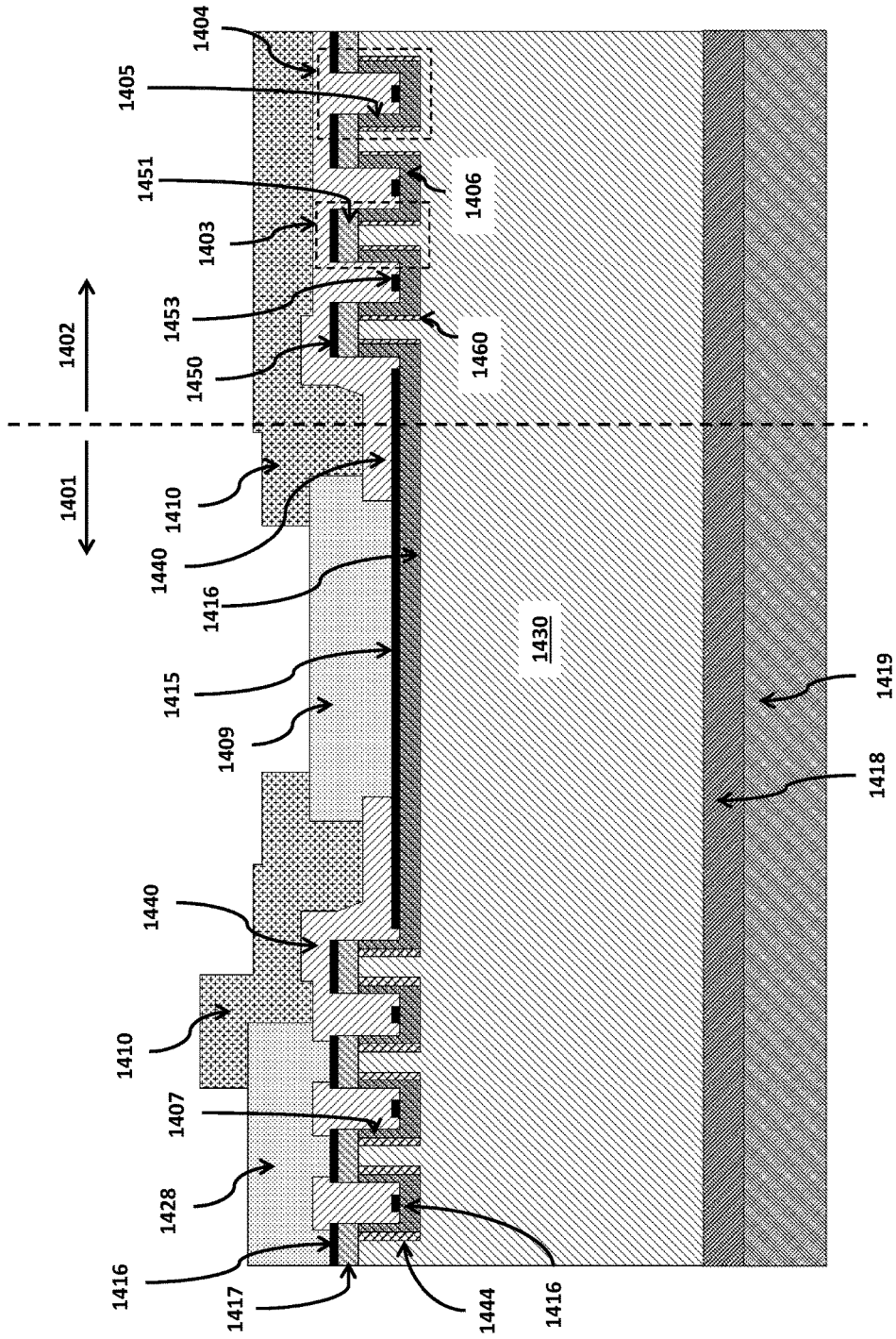
FIG. 14 is a cross-sectional view of a fourth illustrative embodiment of a JFET.

FIG. 14 is a cross-sectional view of a fourth illustrative embodiment of a trench terminated JFET. The fourth embodiment is similar to the second embodiment shown in FIG. 12, but here in FIG. 14 the width of the trenches 1404 in the termination region 1402 are wider than the width of the trenches in the active cell region 1401. Further, a fifth mask is used to separate the first-doping-type implantations for the active cell region 1401 and the termination region 1402. The additional mask is applied after the implantations of the first-doping-type described with reference to FIG. 7. This mask blocks the active cells 1401 but is open in the termination region 1402. Then an additional implantation of the first-doping-type is done at a larger tilt angle, as compared to the tilt angle used for the implantation in the active cell region 1401. As a result, the first-doping-type region on the side wall 1405 is implanted deeper towards the center of the mesa in the termination region 1402 as compared to the analogous structure 1407 in the active region 1401. This makes the mesas 1403 in the termination region 1402 easier to deplete and improves the termination. Also shown in FIG. 14 are drain contact 1419, drain region 1418, drift region 1430, source silicide 1416, source region 1417, channel implant 1444, source electrode 1428, gate silicide 1415, gate region 1416, gate electrode 1409, interlayer dielectric 1440, passivation 1410, termination region silicides 1450 and 1453, and termination doped regions 1406, 1451, and 1460.

Figure 15:
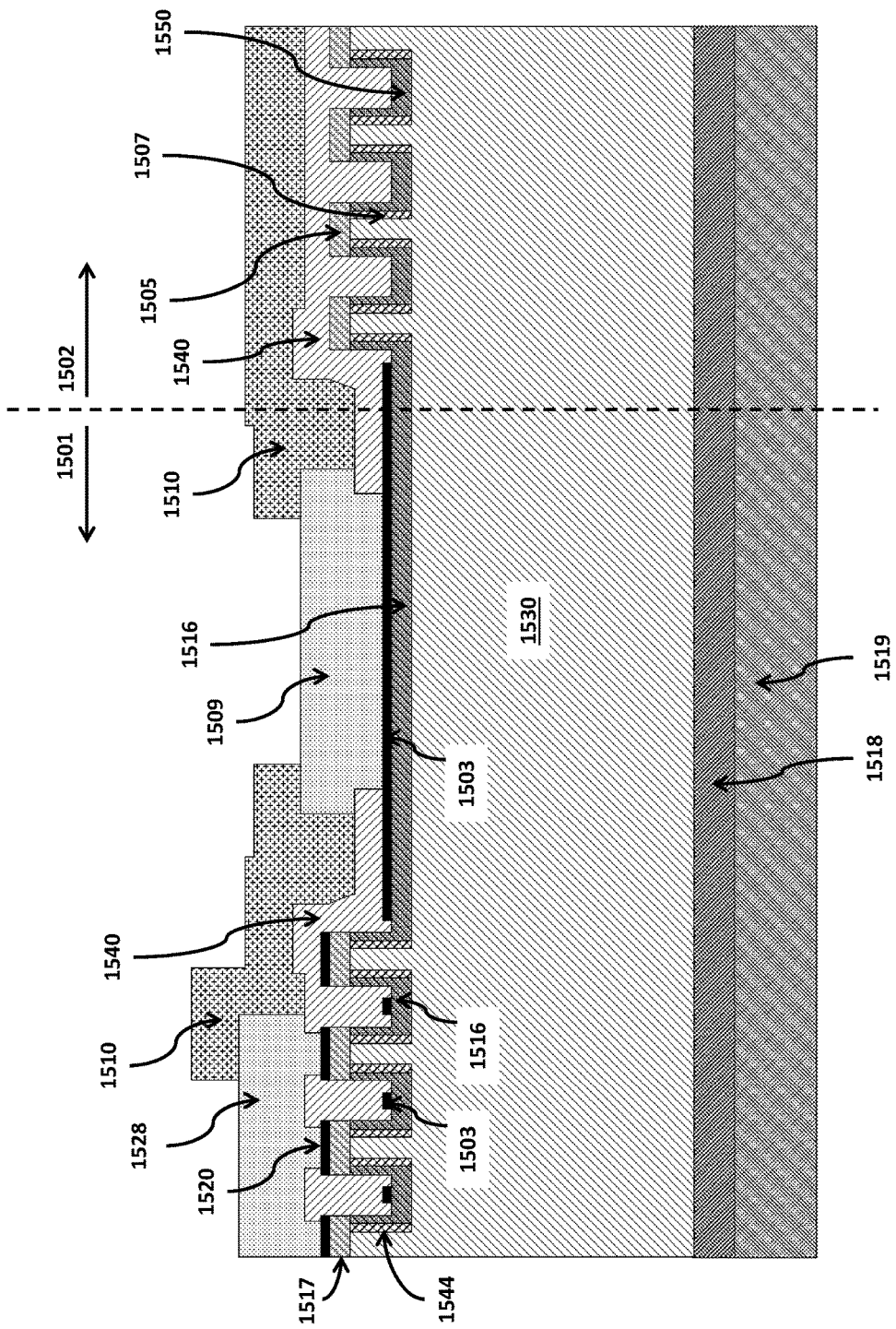
FIG. 15 is a cross-sectional view of a fifth illustrative embodiment of a JFET.

FIG. 15 is a cross-sectional view of a fifth illustrative embodiment of a trench terminated JFET. The fifth embodiment is similar to the second embodiment shown in FIG. 12, but here in FIG. 15 a sixth mask is used so that no silicide will be formed in the termination region 1502. This sixth mask brings the total mask count to five for the process: trench, Ni block, contact, metal, and passivation. Silicide, including gate silicide 1503 and source silicide 1520, only forms in the active cell region 1501. The sixth mask can work either by stopping Ni from being deposited in the termination region 1502, or by leaving oxide in the termination region 1502 so that Ni cannot react with the semiconductor. This would occur during the processes discussed in reference to FIG. 8. Also shown in FIG. 15 are drain contact 1519, drain region 1518, drift region 1530, source region 1517, channel implant 1544, source electrode 1528, gate region 1516, gate electrode 1509, interlayer dielectric 1540, passivation 1510, and termination doped regions 1505, 1507, and 1550.

Figure 16:
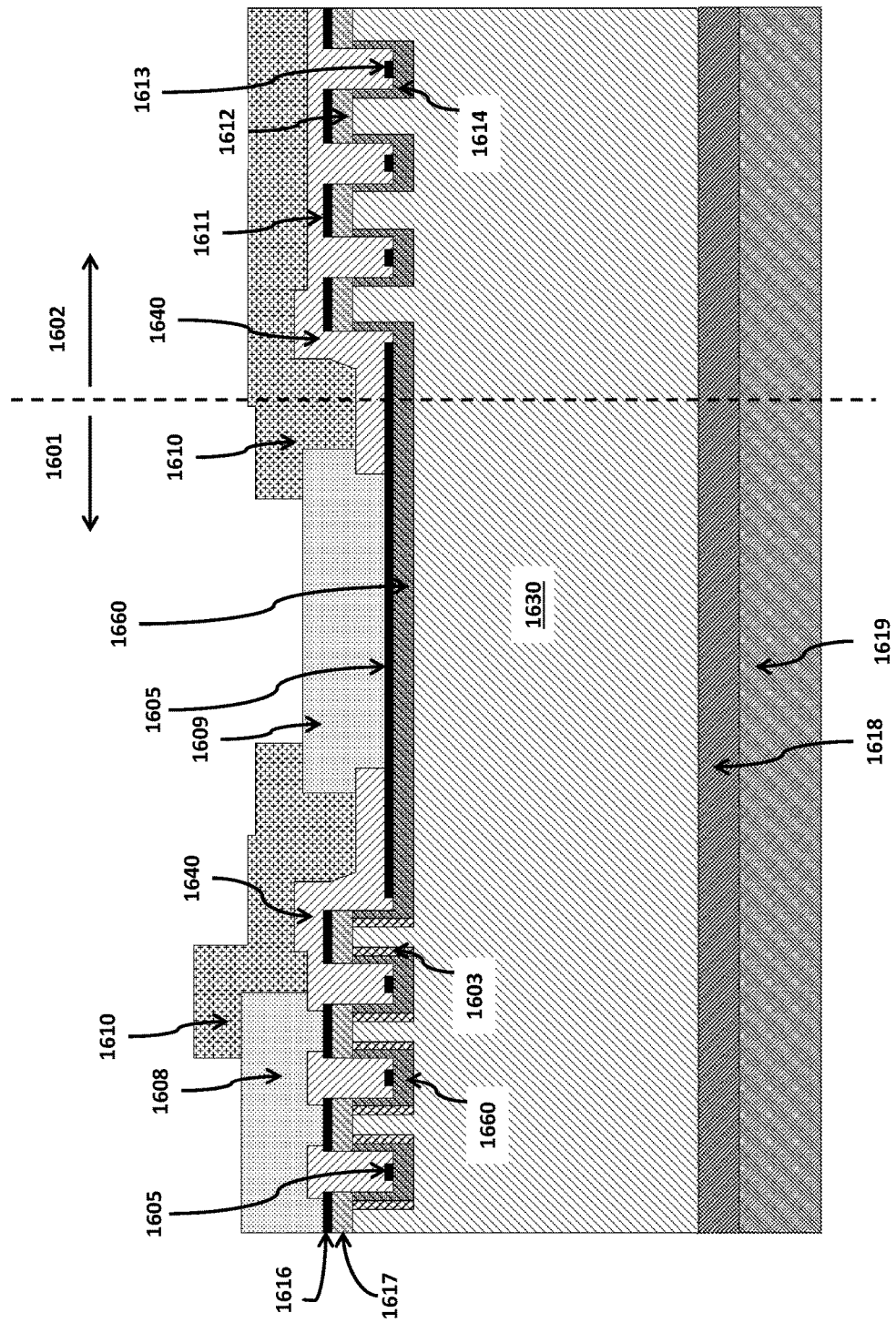
FIG. 16 is a cross-sectional view of a sixth illustrative embodiment of a JFET.

FIG. 16 is a cross-sectional view of a sixth illustrative embodiment of a trench terminated JFET. The sixth embodiment is similar to the second embodiment shown in FIG. 12, but here in FIG. 16 a seventh mask is used to prevent the channel implant of the second type from entering the termination region 1602. The channel implant of the second doping type 1603 only forms in the active cell region 1601. This seventh mask brings the total mask count to five for the process: trench, channel implant block, contact, metal, and passivation. Also shown in FIG. 16 are drain contact 1619, drain region 1618, drift region 1630, source region 1617, source silicide 1616, source electrode 1608, gate region 1660, gate silicide 1603, gate electrode 1609, interlayer dielectric 1640, passivation 1610, and termination silicides 1611 and 1613, and termination doped regions 1612 and 1614.

Figure 17:
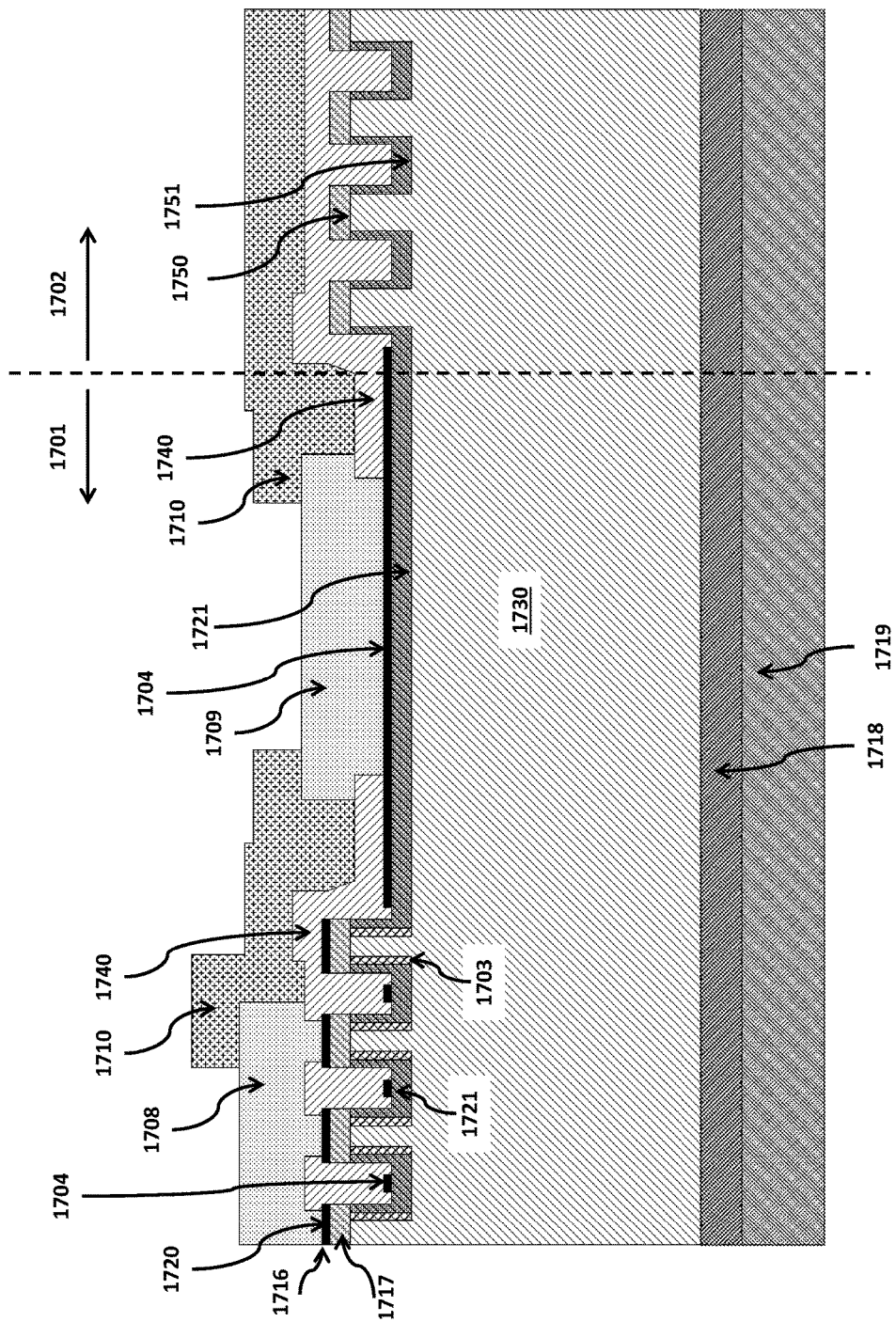
FIG. 17 is a cross-sectional view of a seventh illustrative embodiment of a JFET.

FIG. 17 is a cross-sectional view of a seventh illustrative embodiment of a trench terminated JFET. Here in FIG. 17 a seventh mask is used to prevent the channel implant of the second doping type from getting into the termination region 1702. The seventh mask is also used to prevent the growth of oxide spacers and formation of gate and source silicide in the termination region. One simple method would be to deposit an oxide layer after the gate implants of the first doping type, then patterning it to open only the active area 1701 before performing the further channel implants and silicide formation steps. Thus, the channel implant only forms the second-doping-type region 1703 in the active cells 1701, and the gate silicide 1704 and source silicide 1720 only form in the active cells 1701. This seventh mask brings the total mask count to five for the process: trench, channel implant and silicide block, contact, metal, and passivation. Also shown in FIG. 17 are drain contact 1719, drain region 1718, drift region 1730, source region 1717, source electrode 1708, gate region 1721, gate electrode 1709, channel implant 1703, interlayer dielectric 1740, passivation 1710, and termination doped regions 1750 and 1751.

Figure 18:
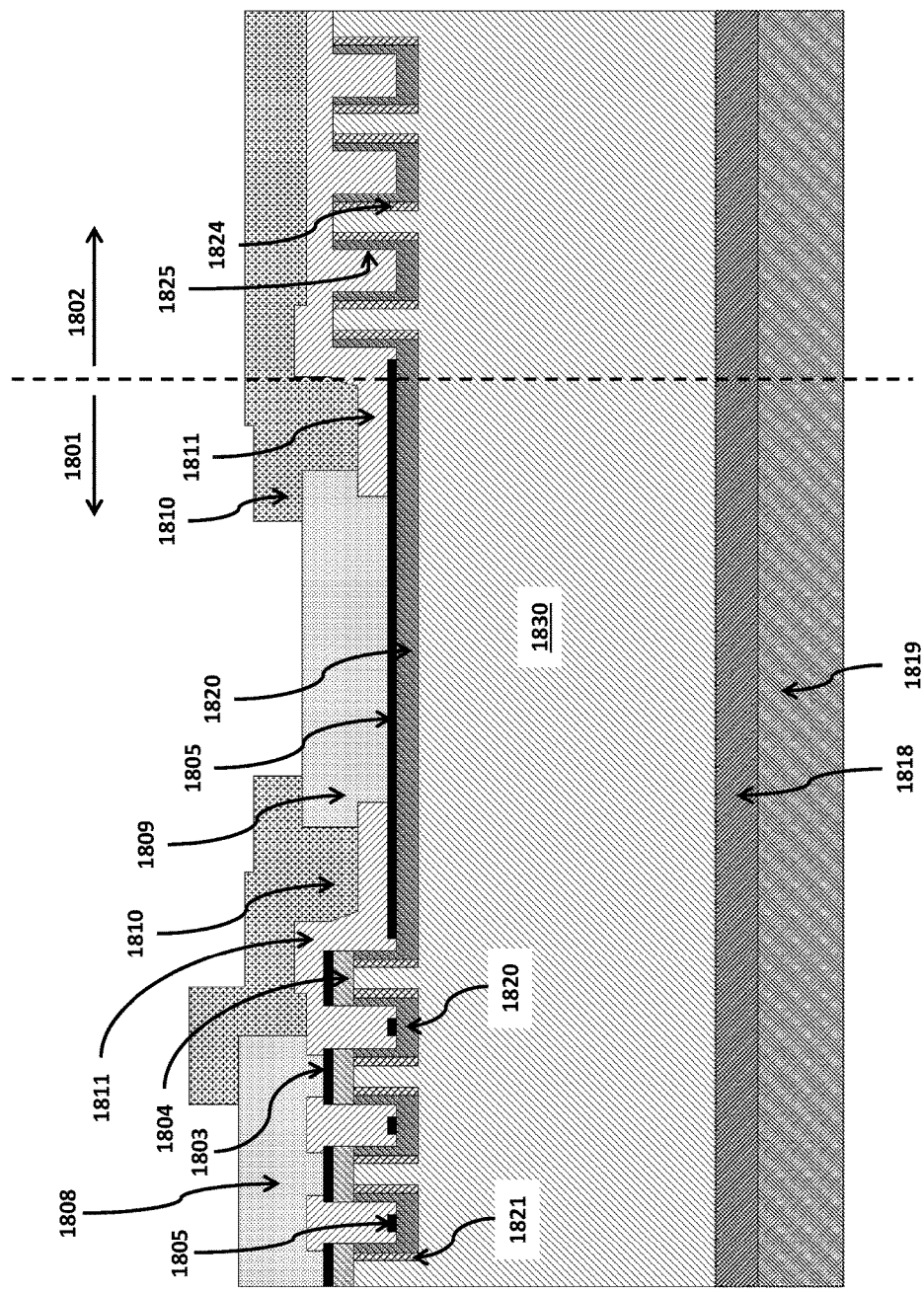
FIG. 18 is a cross-sectional view of an eighth illustrative embodiment of a JFET.

FIG. 18 is a cross-sectional view of an eighth illustrative embodiment of a trench terminated JFET. The eighth embodiment is similar to the fifth embodiment shown in FIG. 15. Here in FIG. 18 an eighth mask is used to keep the heavily doped wafer top layer, which is used to form the source regions 1804 in the active region 1801, from being formed in the termination region 1802. In FIG. 5, the starting wafer is shown as having a layer 502 of a second doping typing that will become the source region. Layer 502 may be created by epitaxy or implantation, for example. The JFET depicted in FIG. 18 can be created by using such a starting wafer by using the eighth mask to control the etching away of the top heavily doped region of the second doping type in the termination region 1802, leaving the top heavily doped region of the second type only in the active region 1801. This eighth mask brings the total mask count to five for the process: source pattern, trench, contact, metal, and passivation.

Alternatively, the JFET depicted in FIG. 18 can be created by using such a starting wafer that does not have the top heavily doped region of the second doping type, and then using the eighth mask to control the implantation of a top heavily doped region of the second doping in the active region termination region 1802, leaving the top heavily doped region of the second type only in the active region. As another alternative, an eighth mask could be used to control the selective removal of source regions in the termination region 1802 after the formation of the mesas. Also shown in FIG. 18 are drain contact 1819, drain region 1818, drift region 1830, source electrode 1808, source silicide 1803, gate region 1820, gate silicide 1805, gate electrode 1809, interlayer dielectric 1811, passivation 1810, channel doping 1821, and termination doped regions 1825 and 1824.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:
1. A vertical JFET, comprising:
   a) a substrate, the substrate having a top and a bottom vertically, the substrate having a perimeter horizontally;
   b) a backside drain connection, the backside drain connection being on the bottom of the substrate; and
   c) on the top of the substrate, an active cell region and a termination region, the active cell region and the termination region each comprising a plurality of mesas and a plurality of trenches;
   d) wherein each mesa comprises gate-doped regions on the sides of the mesa, a source-doped region at the top of the mesa, and, between the gate-doped regions and below the source-doped region, a channel region;
   e) wherein each mesa further comprises, atop the source-doped region, a source contact silicide region; and
   f) wherein each trench comprises, at the bottom of the trench, a gate-doped region connecting to the gate-doped regions of the mesa, and atop the gate-doped region of the trench, a gate contact silicide region;
   g) the vertical JFET further comprising a gate buss connecting the gate contact silicide regions of the active cell region, and a source buss connecting the source contact silicide regions of the active cell region;
   h) wherein the gate contact silicide regions and the source contact silicide regions of the termination region are individually ohmically isolated from each other, from the gate buss, and from the source buss; and
   i) wherein the doping levels of the gate-doped regions, the source-doped regions, and the channel regions, and the width of the mesas in the termination region, are selected such that a punch through voltage of the mesas of the termination region is less than a breakdown voltage of a P-N junction between the gate-doped region and the source-doped region of each mesa of the termination region, such that an off-state blocking voltage of the vertical JFET is the sum of the punch-through voltages of the P-N junctions of the gate-doped regions and the source-doped regions of the termination region.

2. The vertical JFET of claim 1, wherein the substrate comprises silicon carbide.

3. The vertical JFET of claim 1, wherein the substrate comprises GaN, AlN, Ga2O3, or diamond.

4. The vertical JFET of claim 1, wherein the trenches of the termination region are of the same depth as the trenches of the active region.

5. The vertical JFET of claim 1, wherein the trenches of the termination region are of a different width from the trenches of the active region.

6. The vertical JFET of claim 1, wherein:
   j) the termination region surrounds the active cell region; and
   k) the termination region comprises two or more trenches between the active cell region and the perimeter.

7. The vertical JFET of claim 1, further comprising in the mesas of the termination region, between the centers of the mesas and the gate-doped regions, portions of the channel regions that are more heavily doped than the centers of the mesas.

8. A vertical JFET, comprising:
   a) a substrate, the substrate having a top and a bottom vertically, the substrate having a perimeter horizontally;
   b) a backside drain connection, the backside drain connection being on the bottom of the substrate; and
   c) on the top of the substrate, an active cell region and a termination region, the active cell region and the termination region each comprising a plurality of mesas and a plurality of trenches;
   d) wherein each mesa comprises gate-doped regions on the sides of the mesa, a source-doped region at the top of the mesa, and, between the gate-doped regions and below the source-doped region, a channel region;
   e) wherein each mesa of the active cell region further comprises, atop the source-doped region, a source contact silicide region; and
   f) wherein each trench of the active cell region comprises, at the bottom of the trench, a gate-doped region connecting to the gate-doped regions of the mesa, and, atop the gate-doped region of the trench, a gate contact silicide region;
   g) the vertical JFET further comprising a gate buss connecting the gate contact silicide regions, and a source buss connecting the source contact silicide regions;
   h) wherein the doping levels of the gate-doped regions, the source-doped regions, and the channel regions, and the width of the mesas in the termination region, are selected such that a punch through voltage of the mesas of the termination region is less than a breakdown voltage of a P-N junction between the gate-doped region and the source-doped region of each mesa of the termination region, such that an off-state blocking voltage of the vertical JFET is the sum of the punch-through voltages of the P-N junctions of the gate-doped regions and the source-doped regions of the termination region.

9. The vertical JFET of claim 8, wherein the substrate comprises silicon carbide.

10. The vertical JFET of claim 8, wherein the substrate comprises GaN, AlN, Ga2O3, or diamond.

11. The vertical JFET of claim 8, wherein the trenches of the termination region are of the same depth as the trenches of the active region.

12. The vertical JFET of claim 8, wherein the trenches of the termination region are of a different width from the trenches of the active region.

13. The vertical JFET of claim 8, wherein:
   i) the termination region surrounds the active cell region; and
   j) the termination region comprises two or more trenches between the active cell region and the perimeter.

14. The vertical JFET of claim 8, further comprising in the mesas of the termination region, between the centers of the mesas and the gate-doped regions, portions of the channel regions that are more heavily doped than the centers of the mesas.

15. A vertical JFET, comprising:
   a) a substrate, the substrate having a top and a bottom vertically, the substrate having a perimeter horizontally;
   b) a backside drain connection, the backside drain connection being on the bottom of the substrate; and c) on the top of the substrate, an active cell region and a termination region, the active cell region and the termination region each comprising a plurality of mesas and a plurality of trenches;
d) wherein each mesa comprises gate-doped regions on the sides of the mesa, a source-doped region at the top of the mesa, and, between the gate-doped regions and below the source-doped region, a channel region;
e) wherein each mesa further comprises, atop the source-doped region, a source contact silicide region;
f) wherein each trench comprises, at the bottom of the trench, a gate-doped region, and, atop the gate-doped region of the trench, a gate contact silicide region; and
g) wherein, in the trenches of the active cell region, the gate-doped region at the bottom of the trench connects to the gate-doped regions of the sides of the mesa, and in the trenches of the termination region, the gate-doped region at the bottom of the trench does not connect to the gate-doped regions of the sides of the mesa;
h) the vertical JFET further comprising a gate buss connecting the gate contact silicide regions of the active cell region, and a source buss connecting the source contact silicide regions of the active cell region;
i) wherein the gate contact silicide regions and the source contact silicide regions of the termination region are individually ohmically isolated from each other, from the gate buss, and from the source buss; and
j) wherein the doping levels of the gate-doped regions, the source-doped regions, and the channel regions, and the width of the mesas in the termination region, are selected such that a punch through voltage of the mesas of the termination region is less than a breakdown voltage of a P-N junction between the gate-doped region and the source-doped region of each mesa of the termination region, such that an off-state blocking voltage of the vertical JFET is the sum of the punch-through voltages of the P-N junctions of the gate-doped regions and the source-doped regions of the termination region.

16. The vertical JFET of claim 15, wherein the substrate comprises silicon carbide.

17. The vertical JFET of claim 15, wherein the substrate comprises GaN, AlN, Ga2O3, or diamond.

18. The vertical JFET of claim 15, wherein the trenches of the termination region are of the same depth as the trenches of the active region.

19. The vertical JFET of claim 15, wherein the trenches of the termination region are of a different width from the trenches of the active region.

20. The vertical JFET of claim 15, wherein:
k) the termination region surrounds the active cell region; and
l) the termination region comprises two or more trenches between the active cell region and the perimeter.

* * * * *